(12) United States Patent
Bhushan et al.

(10) Patent No.: US 7,355,902 B2
(45) Date of Patent: Apr. 8, 2008

(54) METHODS AND APPARATUS FOR INLINE CHARACTERIZATION OF HIGH SPEED OPERATING MARGINS OF A STORAGE ELEMENT

(75) Inventors: Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 11/431,993

(22) Filed: May 11, 2006

(65) Prior Publication Data

US 2007/0263476 A1    Nov. 15, 2007

(51) Int. Cl.
*G11C 11/34* (2006.01)
(52) U.S. Cl. .......................... 365/189.05; 365/189.08; 365/230.08; 365/233.5
(58) Field of Classification Search ........... 365/189.05, 365/189.08, 230.08, 233.5
See application file for complete search history.

(56) References Cited

U.S. PATENT DOCUMENTS 6,741,505 B2 * 5/2004 Yokozeki ............... 365/189.15

6,798,261 B1  9/2004 Bhushan et al.

OTHER PUBLICATIONS

D.J. Pearson et al., "Technique for Rapid, In-Line Characterization of Switching History in Partially Depleted SOI Technologies," Proc. of 2004 SOI Conference, 2 pages, 2004.
M. Ketchen et al., "High Speed Test Structures for In-Line Process Monitoring and Model Calibration," Proc. 2005 IEEE International Conference on Microelectronic Test Structures, 6 pages, 2005.

* cited by examiner

*Primary Examiner*—Tuan T. Nguyen
*Assistant Examiner*—Nam Nguyen
(74) *Attorney, Agent, or Firm*—Ido Tuchman; Ryan, Mason & Lewis, LLP (57) ABSTRACT

A method for inline characterization of at least one high speed operating margin of a storage element is provided. An output of at least one latch of the integrated circuit device is transitioned from a first output logic state to a second output logic state. The storage element is accessed at least once in response to the transition of the output of the at least one latch to perform at least one of a write operation and a read operation. A state of at least one output latch is observed corresponding to a state of the storage element. The transitioning, accessing and observing steps are repeated for one or more adjustable parameters to determine at least one high speed operating margin of the storage element.

20 Claims, 9 Drawing Sheets

| TIME STEP | 1 | 2 | 3 | 4 | 5 |
|---|---|---|---|---|---|
| SEL | 1 | 1 | 1 | 1 | 1 |
| ARM | 0 | 0 | 0 | 1 | 1 |
| LAUNCH | 0 | 1 | 0 | 0 | 1 |

| POSITION | PULSE WIDTH | a0 | a1 | a2 |
|---|---|---|---|---|
| 1 | 15 ps | 0 | 0 | 0 |
| 2 | 22 ps | 0 | 0 | 1 |
| 3 | 31 ps | 0 | 1 | 0 |
| 4 | 40 ps | 0 | 1 | 1 |
| 5 | 48 ps | 1 | 0 | 0 |
| 6 | 57 ps | 1 | 0 | 1 |
| 7 | 66 ps | 1 | 1 | 0 |
| 8 | 74 ps | 1 | 1 | 1 |

| POSITION | W-R DELAY | b0 | b1 | b2 |
|---|---|---|---|---|
| 1 | 70 ps | 0 | 0 | 0 |
| 2 | 120 ps | 0 | 0 | 1 |
| 3 | 400 ps | 0 | 1 | 0 |
| 4 | 3.2 ns | 0 | 1 | 1 |
| 5 | 26 ns | 1 | 0 | 0 |
| 6 | 200 ns | 1 | 0 | 1 |
| 7 | 1.6 μs | 1 | 1 | 0 |
| 8 | 13 μs | 1 | 1 | 1 |

FIG. 9

| SUPPLY | POWERING |
|---|---|
| AWLPWR | WORD LINE DRIVER |
| ABLPWR | BIT LINE DRIVERS |
| ACLPWR | CELL INVERTERS |
| VDD | SUPPORT CIRCUITRY |
| I/O VDD | OUTPUT CIRCUITRY |

FIG. 10

| FUNCTION | m1 | m2 |
|---|---|---|
| WRITE - READ | 1 | 0 |
| WRITE ONLY | 1 | 1 |
| READ ONLY | 0 | 0 |
| RO MONITOR | 0 | 1 |

FIG. 13

METHODS AND APPARATUS FOR INLINE CHARACTERIZATION OF HIGH SPEED OPERATING MARGINS OF A STORAGE ELEMENT

FIELD OF THE INVENTION

The present invention relates generally to integrated circuit devices and, more particularly, to inline characterization of at least one high speed operating margin of a storage element.

BACKGROUND OF THE INVENTION

Static Random Access Memory (SRAM) constitutes a large portion of modern microprocessor designs. Stand alone SRAM chips also constitute a significant market. SRAM cell failures are a major consideration in all SRAM designs. Due to the fact that all cells in a given SRAM chip must function properly, the maximum operating speed and the minimum operating voltage of the SRAM chip are determined by the poorest performing or weakest cell. SRAM chips are extensively tested and failing cells are replaced when necessary and possible via various redundancy schemes. Once an SRAM chip has been qualified to be "good," potential future cell failures may still exist. Such potential cell failures may be radiation-induced, pattern-dependent that escaped the standard testing, aging effects, or switching history effects in the case of partially depleted silicon on insulator (PDSOI) technology.

Pattern dependent fails may involve interaction among a number of cells in a local area switching in some particular worst case sequence. The circuit behavior in these situations depends on the amplitude of the cell power supply voltage as well as the amplitude of the signals that write and read the cells. In the case of PDSOI technology there are also floating body related effects that depend on the previous switching history that can lead to SRAM cell fails. For example, the stability of an SRAM cell against erroneous change of state during a read operation is a function of how long it has been since the cell was written. The worst case is a read immediately following a write. The situation improves as the write to read time increases up to about 10-100 μs, after which it becomes time independent. It is important to be able to characterize such behavior on a regular basis.

Such a characterization may be achieved by measuring the minimum operating power supply voltage (Vmin) of one or more cells as a function of the time delay between write and read. It is also of value to be able to characterize the intrinsic write and read times of memory cells as a function of various bias voltages. It is important to appreciate that while the absolute values of such voltages and times will vary from cell to cell, their dependencies on bias conditions represents a common behavior that can be understood and tracked by measuring just a small number of cells. In principal such behavior can be measured as high speed bench tests of the appropriately designed test structures. In practice this is seldom or never done and instead the nature of these effects is inferred from direct current (DC) or alternating current (AC) measurements on a large (>1 Mb) SRAM array, with a considerable degree of ambiguity, often augmented with basic DC current-voltage characterization of a few cells.

Thus, a need exists for test structures that may be used to efficiently measure such effects under high speed conditions, on a regular basis, with standard inline test equipment using only DC inputs and outputs.

SUMMARY OF THE INVENTION

The present invention provides techniques for inline characterization of high speed operating margins of a storage element.

For example, in one aspect of the present invention, a method for characterization of at least one high speed operating margin of a storage element is provided. An output of at least one latch of the integrated circuit device is transitioned from a first output logic state to a second output logic state. The storage element is accessed at least once in response to the transition of the output of the at least one latch to perform at least one of a write operation and a read operation. A state of at least one output latch is observed corresponding to a state of the storage element. The transitioning, accessing and observing steps are repeated for one or more adjustable parameters to determine at least one range of adjustable parameter values in which the storage element operates.

In an additional embodiment of the present invention the at least one latch is transitioned in response to a substantially DC input, and the state of the at least one output latch is observed in accordance with a substantially DC output.

In further embodiments of the present invention, the at least one latch is a first latch of the integrated circuit device and the storage element is an SRAM cell. In such an embodiment, the storage element is accessed when a logic state is written into the SRAM cell in response to the transition of the output of the first latch. Additionally, the at least one latch may also be a second latch of the integrated circuit device whose output is transitioned in response to the transition of the output of the first latch. In such a further embodiment, the storage element is accessed when at least one level representative of a logical state is read from at least one node of the SRAM cell in response to the transition of the output of the second latch.

The one or more adjustable parameters may include a voltage level, a pulsewidth of a bit line set pulse, a pulsewidth of a wordline write pulse, a pulsewidth of a read pulse, and a write-to-read delay. The at least one range of adjustable parameter values in which the storage element operates may include the write operating margin of the SRAM cell, the read operating margin of the SRAM cell and the write and read operating margins of the SRAM cell as function of write-to-read delay.

In accordance with another aspect of the invention, and integrated circuit device is provided having at least one latch with an output that transitions from a first output logic state to a second output logic state. The integrated circuit device also has a storage element, which is accessed at least one in response to a transition of the output of the at least one latch to perform at least one of a write operation and a read operation. Additionally, the integrated circuit device has at least one output latch having a state capable of being observed that corresponds to a state of the storage element. At least one range of adjustable parameter values in which the storage element operates is determined from the observation of the state of the at least one output latch for one or more adjustable parameters.

In this structure the wordline driver, the bitline drivers, the SRAM cell inverters, the local control logic, and the output circuitry may be all on heavily decoupled independent power supplies, sharing a common ground. This fully self-timed test structure can be thoroughly measured using only DC inputs and outputs, and an essential subset of the tests are compatible with standard inline parametric test capability. Straightforward extensions of the circuit described can be used to measure the minimum SRAM cell read time under various bias conditions, to individually characterize the high speed behavior of multiple cells in an array, to characterize the high speed behavior of individual cells in scenarios involving multiple reads and writes, and to characterize the collective high speed behavior of a set of cells in scenarios of multiple reads and writes where more than one cell is being written and/or read. These extensions are as well fully self-timed and can be thoroughly measured using only DC inputs and outputs.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, the present invention introduces techniques for inline characterization of high speed operating margins of a storage element.

Figure 1:
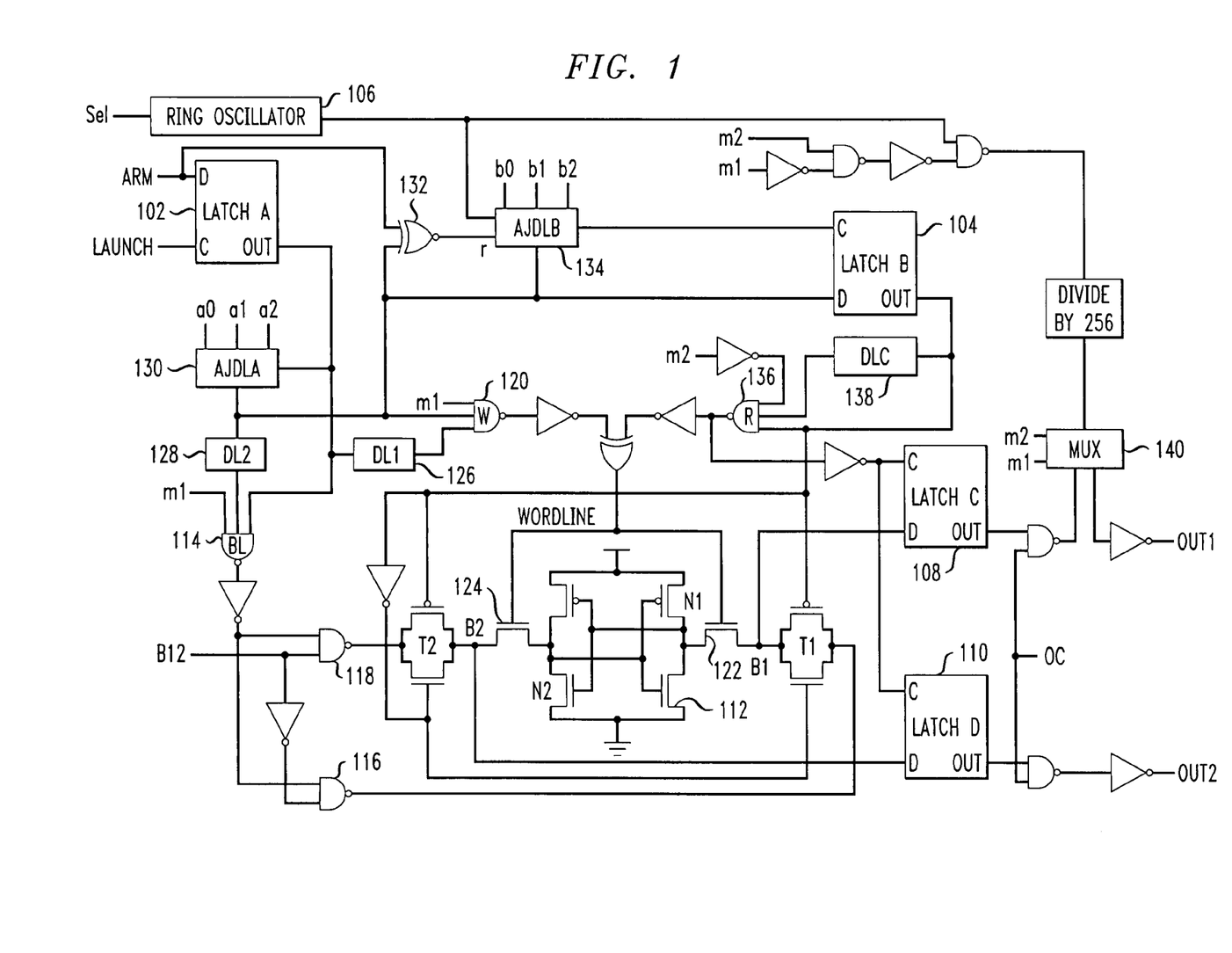
FIG. 1 is a circuit diagram illustrating an SRAM test structure, according to an embodiment of the present invention.

Referring initially to FIG. 1, a top level circuit diagram illustrates inline test structure circuitry, according to an embodiment of the present invention. Such circuitry allows a single storage device, such as, for example, an SRAM cell, to be exercised through a variety of high speed scenarios by a set of self-timed control circuits consisting of latches and combinational logic. Further, only low frequency inputs and outputs, such as, for example, DC inputs and outputs, are required. In all scenarios a single sharp waveform edge, formed in response an arbitrary input and transitioning from a logic "0" state to a logic "1" state on any time scale, initiates a self-timed chain of events entirely within the test structure circuitry.

Figure 2:
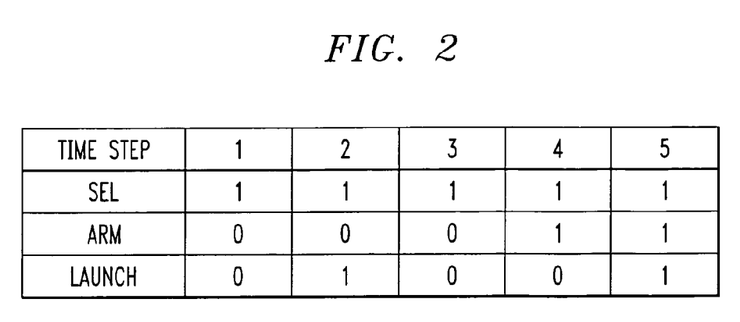
FIG. 2 is a table illustrating time stepped inputs for latch reset and output transition, according to an embodiment of the present invention.

In order to initiate testing of an SRAM cell in the test structure circuitry of FIG. 1, LatchA 102 and LatchB 104 are initially reset and a sharp waveform edge is generated from LatchA 102. FIG. 2 is a table showing a sequence of inputs in specified time steps necessary to accomplish this reset and generation, according to an embodiment of the present invention. Each step indicated in the table of FIG. 2 may be, for example, a few milliseconds (ms) in length.

Time steps 1 through 3 of FIG. 2 reset LatchA 102 and LatchB 104, ensuring that there are logic "0" states at their outputs. A ring oscillator 106 of FIG. 1, for example with 51 gate-loaded inverter stages, is enabled by a SEL input in time step 1. In time step 2, a logic "0" state is established at the output of LatchA 102 by providing a LAUNCH input signal to a clock input of LatchA 102, while the data port of LatchA 102 remains at a logic "0" state without an ARM input signal. During time step 3, the clock input to LatchB 104 is oscillating due to its connection to ring oscillator 106. Because the data input to LatchB 104 is a logic "0" state at this time, the output of LatchB 104 is set to a logic "0" state.

In time step 4 of FIG. 2, a logic "1" state is preloaded into a data port of LatchA 102 through the ARM input. With the logic "1" state preloaded into the data port of LatchA 102, its output remains at a logic "0" state until the LAUNCH input to the clock input of LatchA 102 is provided allowing the preloaded logic "1" state to pass to the output. The only requirement of the LAUNCH input signal is that it undergoes a transition from a logic "0" state to a logic "1" state, the details of the waveform, including the duration of the transition, are unimportant. The output from LatchA 102 is a very sharp waveform edge that occurs at some point during the rise of the LAUNCH signal, and subsequent events are self-timed with respect to this sharp waveform edge. Note that during this latch reset and sharp waveform edge generation sequence, clock inputs to both LatchC 108 and LatchD 110 of FIG. 1 remain at logic "0" states with their outputs fixed.

Referring back to FIG. 1, a subsequent set of events is considered for a first mode of operation of the test structure circuitry, specifically a write-read operation of the test structure circuitry on a storage device, more specifically, an SRAM cell. This mode of operation is specified based on the following inputs to the test structure circuitry: B12="1", m1="1", and m2="0". In this embodiment of the present invention, a logic "0" state has been read from cell 112 (N2="1", N1="0") so that at the beginning of the present cycle Out2="1", and Out1="0".

The sharp waveform edge emerging from LatchA 102 instigates creation of a bit line set pulse, generated from a bit line set pulse generator 114. The bit line set pulse drives NAND2 bit line drivers 116, 118. Transmission gates T1, T2 are initially both open since the output of LatchB 104 at this stage is a logic "0" state. Thus, by the action of bitline NAND2 drivers 116, 118, both bitlines are at logic "1" states until the bit line set pulse arrives, at which point one of the two bit lines is set to a logic "0" state for the duration of the bit line set pulse. With B12="1" it is the left side bitline, B2, that is set to a logic "0" state.

The sharp waveform edge emerging from LatchA 102 also instigates creation of a wordline write pulse from a wordline write pulse generator 120. The write pulse is applied to the wordline. This pulse results in passgates 122, 124 of cell 112 being opened and cell 112 is written with a logic "1" state on N1 and a logic "0" state on N2 corresponding to the values of B1 and B2 during the bit line set pulse. Passgates 122, 124 then close with the termination of the write pulse and B2 is restored to a logic "1" state with the termination of the bit line set pulse, leaving both bitlines high. This completes the write operation.

Delays DL1 126 and DL2 128 may be inserted in the test structure circuitry such that the bitline set pulse is wider than and straddles the wordline write pulse. In a preferred embodiment of the present invention, the width of both pulses is synchronously adjustable in intervals of approximately 8.5 picoseconds (ps) by a first adjustable delay circuit (AJDLA) 130, which is set to one of eight values by the output of a three bit decoder, as described in further detail below.

The sharp waveform edge emerging from LatchA 102 also starts a counter through the action of XNOR 132 as well as a signal down a delay chain portion of a second adjustable delay circuit (AJDLB) 134 which creates the write-to-read time delay. Further, the sharp waveform edge emerging from LatchA 102 sets a logic "1" state on the data port of LatchB 104. At some time determined by the delay of AJDLB 134, a signal reaches the clock input of LatchB 104 and the logic "1" state on its data input passes to its out terminal in the form of a second sharp rising waveform edge.

This second waveform edge emerging from LatchB 104 turns off transmission gates T1, T2, leaving the precharged bitlines floating at a logic "1" state. The second waveform edge emerging from LatchB 104 also instigates generation of a wordline read pulse from a wordline read pulse generator 136. The read pulse opens passgates 122, 124 of cell 112 and also puts a logic "1" state on the clock ports of LatchC 108 and LatchD 110. With a logic "0" state on N2 of cell 112, B2 is pulled down to a logic "0" state while B1 remains at a logic "1" state. Both the logic "1" state and the logic "0" state are captured by LatchC 108 and LatchD 110 respectively before their clock signals are returned to a logic "0" state with the falling edge of the read pulse. Not shown in FIG. 1 are two inverters before each of LatchC 108 and LatchD 110, configured such that an SRAM sized inverter actually serves as a sense amp on each bitline. This completes the read operation. With input OC set equal to "1" the outputs of LatchC 108 and LatchD 110 can then be read out as Out1, Out 2, respectively.

The read pulse width is set by a delay chain (DLC) 138, for example, at approximately 120 ps. As in the case of the write pulse, the read pulse may be made adjustable. The time delay between the end of the write pulse and the beginning of the read pulse is set by AJDLB 134. AJDLB 134 is a combination of delay chain and ring oscillator driven resettable counter with a delay that may cover, for example, a range from under 100 ps to over 10 μs.

Figure 3:
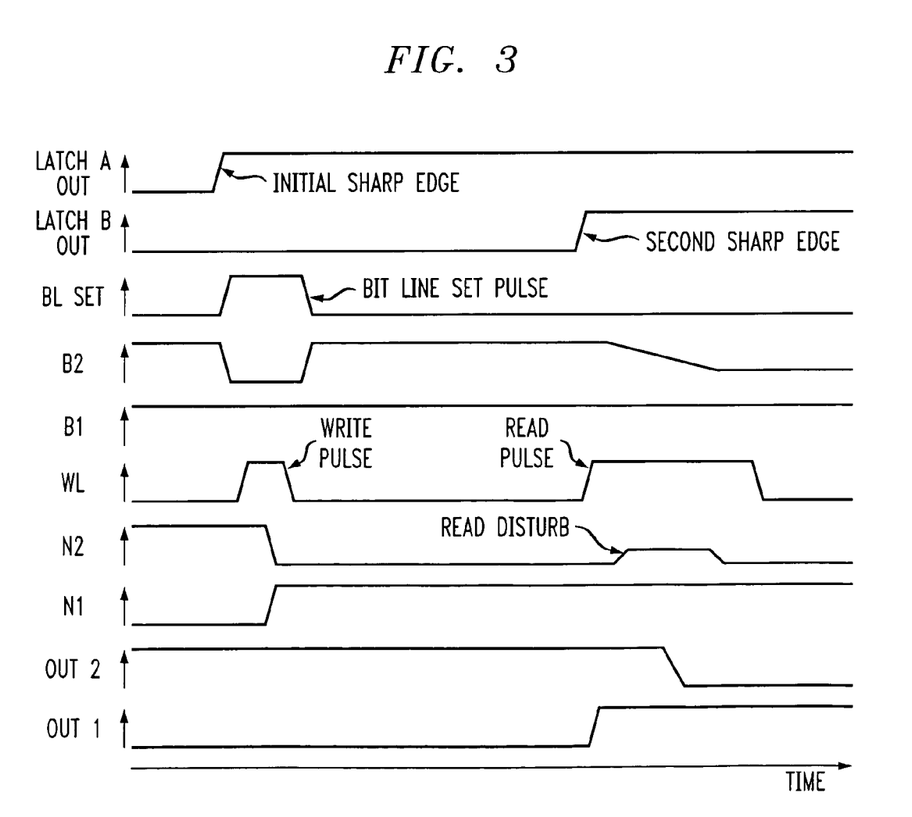
FIG. 3 is a diagram illustrating a set of waveforms corresponding to write and read operations of the SRAM cell of FIG. 1, according to an embodiment of the present invention.

Referring now to FIG. 3, a diagram illustrates a set of waveforms corresponding to write and read operations of the test structure circuitry of FIG. 1, according to an embodiment of the present invention. The three important pulses in this sequence are illustrated: the bitline set pulse, the wordline write pulse and the wordline read pulse. As described above, an initial sharp waveform edge is generated from LatchA 102, resulting in a bit line set pulse and a write pulse. As illustrated, the width of the bit line set pulse preferably straddles that of the write pulse. Further, the bit line set pulse results in a transition of B2 from a logic "1" state to a logic "0" state for the extent of the bit line pulse. The write pulse results in a transition of the logic states of both nodes N1, N2 of cell 112.

Additionally, as described above, the second sharp waveform edge generated from LatchB 104 results in the generation of a read pulse. The read pulse brings B2 back down to a logic "0" state and results in a transition of the logic states of the outputs. The read pulse also induces a disturb on the left node N2 of cell 112.

Figure 4:
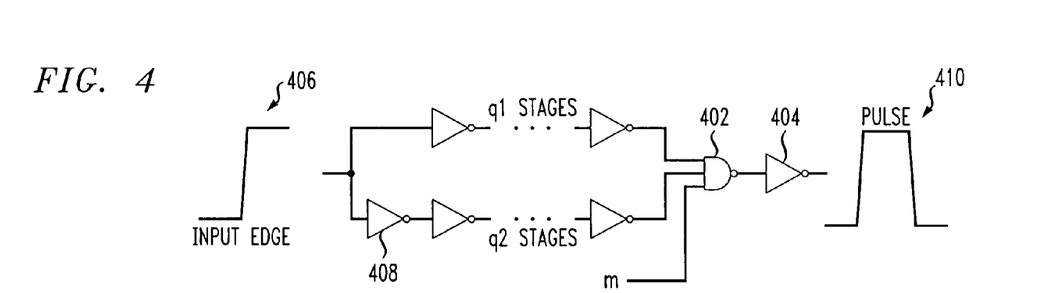
FIG. 4 is a circuit diagram illustrating a pulse generator, according to an embodiment of the present invention.

Referring now to FIG. 4, a circuit diagram illustrates a pulse generator, according to an embodiment of the present invention. This may be considered a detailed description of bit line pulse generator 114, wordline write pulse generator 120, and wordline read pulse generator 136 of FIG. 1. This pulse generation circuit consists of a NAND3 402 followed by an inverter 404 and preceded by two logic chains of different length driven by a common rising edge 406. The chains differ in length by an odd number of inverting stages 408, and the width of an output pulse 410 is simply the difference in the delay of the two chains. An input m is used to enable the pulse generator.

Figure 5:
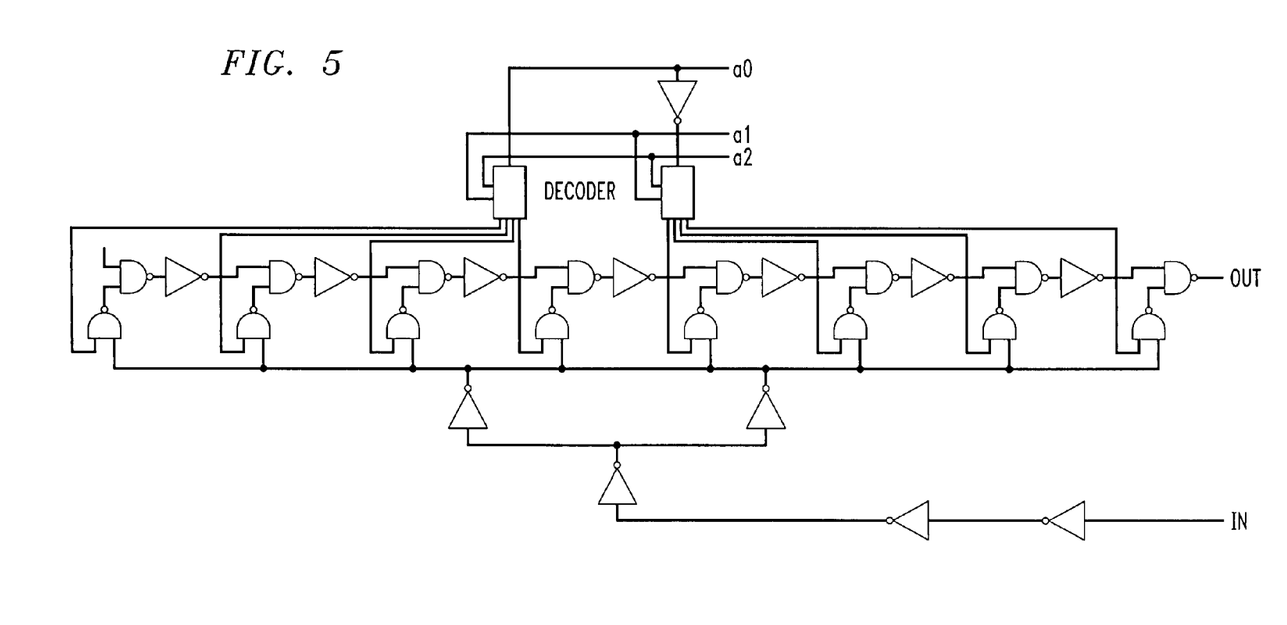
FIG. 5 is a circuit diagram illustrating a variable delay generator for width of a write pulse, according to an embodiment of the present invention.
Figure 6:
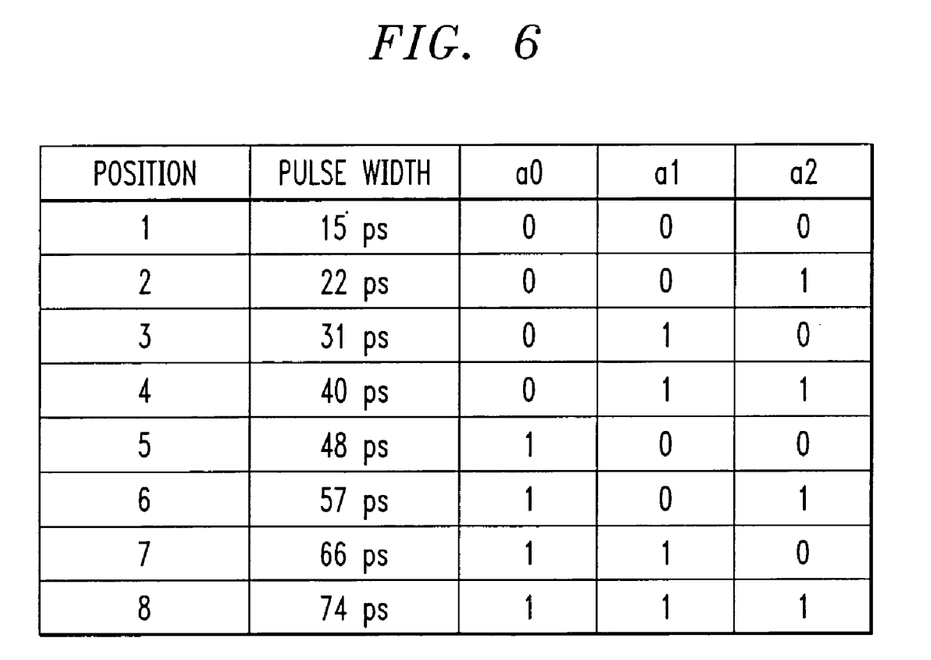
FIG. 6 is a table showing write pulsewidths for decoder settings, according to an embodiment of the present invention.

Referring now to FIG. 5, a circuit diagram illustrates a variable delay generator for write pulse width, according to an embodiment of the present invention. This may be considered a detailed description of AJDLA 130 of FIG. 1. Pulsewidths from schematic based simulations for various decoder settings of the delay generator are shown in a table of FIG. 6. The layout dependence of the delay numbers themselves may be fairly strong so it is important to do full extraction based simulations to do any detailed absolute comparison between model and hardware. Note that the position 1 pulsewidth represents the difference in delay of two paths much of which are outside of AJDLA 130. Also the delay step within AJDLA 130 will be subject to the statistical delay variations among the individual components.

Figure 7:
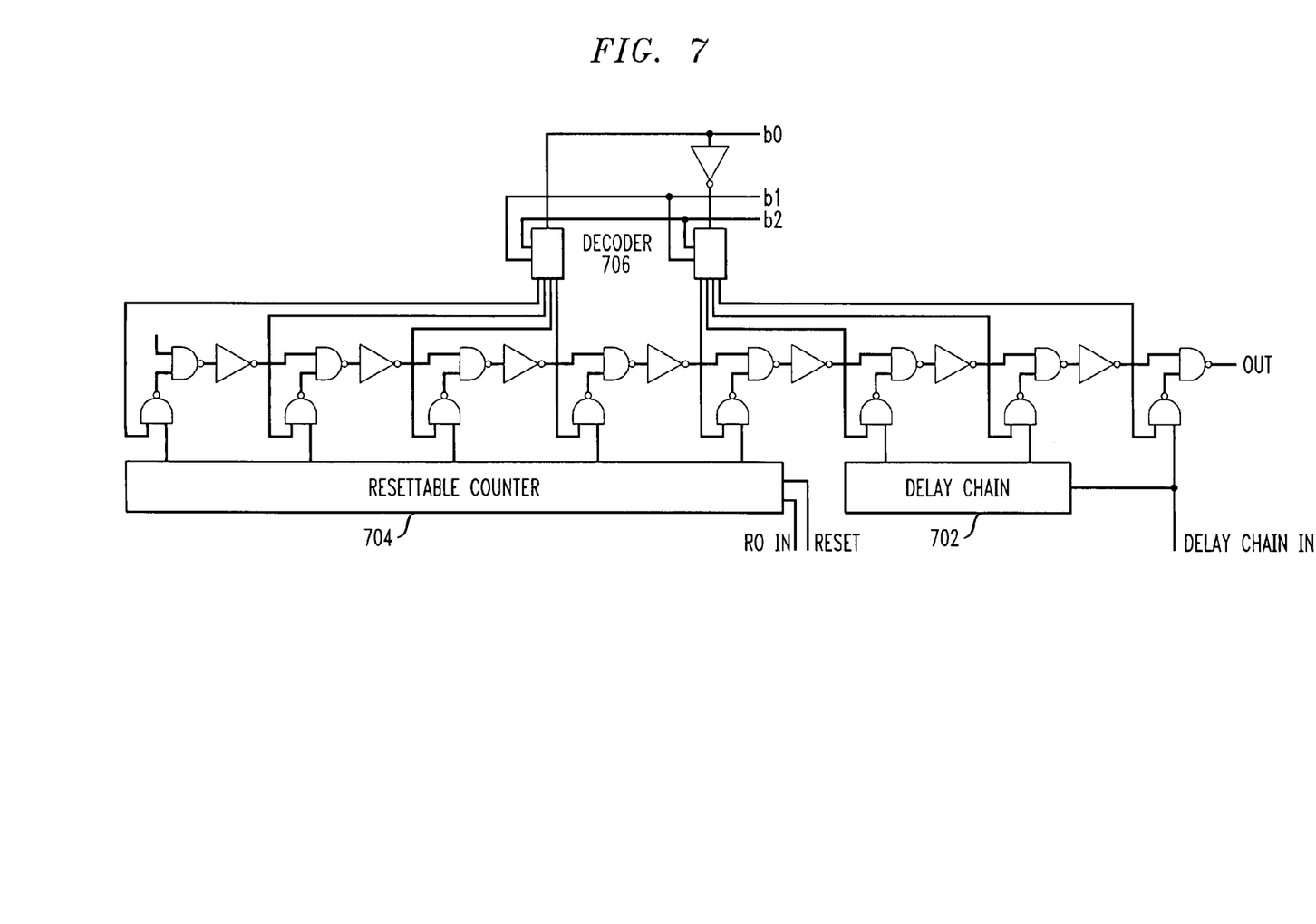
FIG. 7 is a circuit diagram illustrating a variable delay generator for write-to-read time, according to an embodiment of the present invention.
Figure 8:
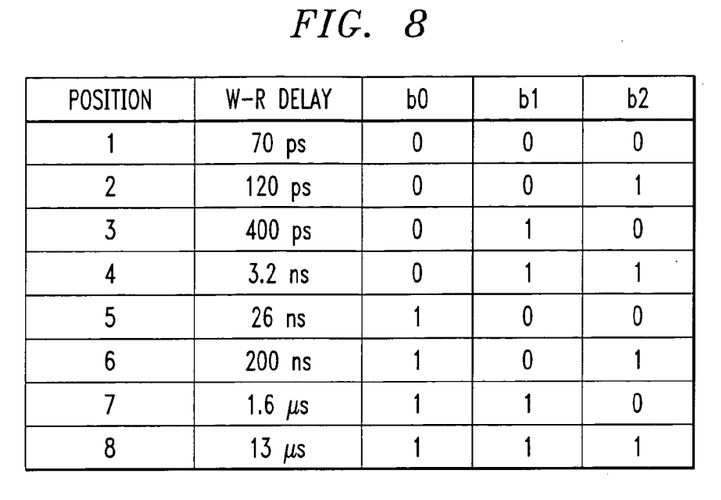
FIG. 8 is a table showing write-to-read delays for decoder settings, according to an embodiment of the present invention.

Referring now to FIG. 7, a circuit diagram illustrates a variable delay generator for write-to-read time, according to an embodiment of the present invention. This may be considered a detailed description of AJDLB 134 of FIG. 1. This is a versatile circuit covering over five orders of magnitude in delay. It consists of a standard delay chain configuration 702 for delays up to about 400 ps followed by a ring oscillator driven resettable counter 704 for delays of up to over 10 μs. As shown in the figure the outputs from various tap points are muxed together with the one of eight active tap points being selected by the output from a three bit decoder 706. The delay chain is structured from the same stages as the ring oscillator so that the frequency measurement of the ring oscillator serves as a calibration for both. Since the initial sharp edge coming from LATCHA can occur at any time during the cycle of the ring oscillator, there is an uncertainty on the order of the period of the ring oscillator in all of the RO-based write-to-read (W-R) delays (decoder positions 4-8). FIG. 8 provides approximate values for delays associated with various decoder settings assuming an RO stage delay of 8 ps. Especially for the smallest delay values, which involve delay components from the delay chain and elsewhere, extraction based simulations should be used for any detailed absolute model to hardware comparisons.

Figure 9:
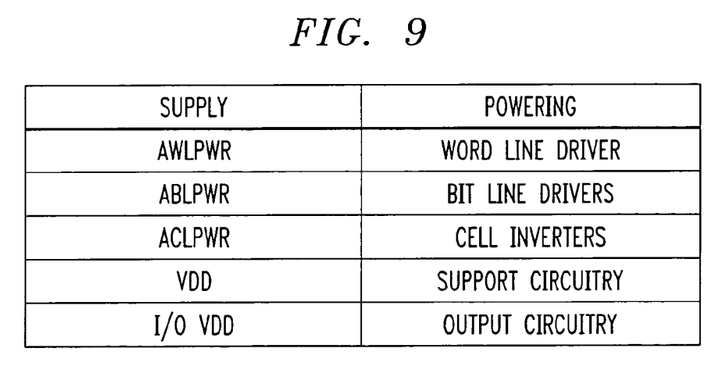
FIG. 9 is a table illustrating power supplies, according to an embodiment of the present invention.

Referring now to FIG. 9, a table illustrates power supplies, according to an embodiment of the present invention. The circuit has five independent heavily decoupled power supplies all sharing a common ground which connects to four I/O pads. The power supplies power wordline drivers, bit line drivers, cell inverters, support circuitry, and output circuitry independently. The test structure circuitry can be used to characterize the at speed behavior of the cell over a wide range of bias conditions, for example Vmin of the cell inverters as a function of write-to-read delay can be directly measured.

Figure 10:
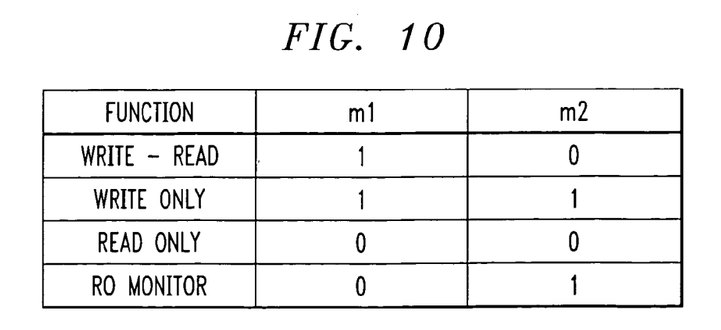
FIG. 10 is a table illustrating modes of operation for the SRAM test structure, according to an embodiment of the present invention.

Referring now to FIG. 10, a table illustrates modes of operation for the SRAM test structure circuitry, according to an embodiment of the present invention. There are four different modes of operation of the test structure circuitry determined by the values of m1 and m2. The first mode is the write-read operation previously described. The second is a write-only mode of operation. The third is a read-only mode of operation. The fourth is a ring oscillator monitor configuration in which the frequency of the ring oscillator can be measured.

Figure 11:
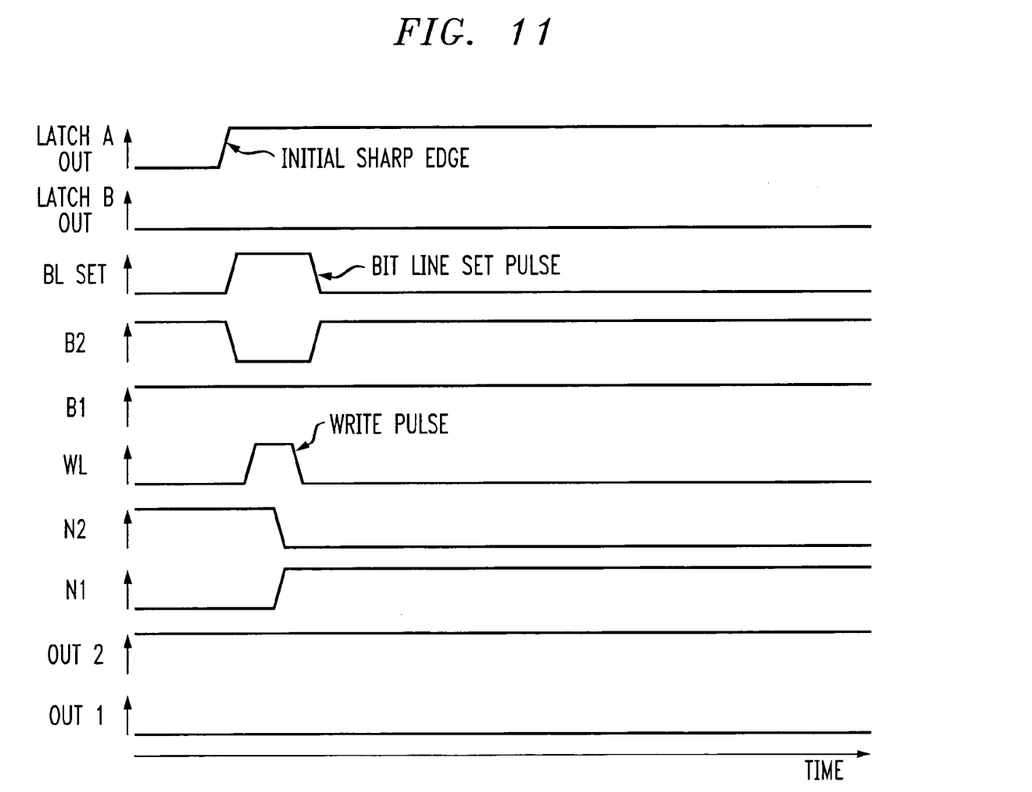
FIG. 11 is a diagram illustrating a set of waveforms corresponding to a write-only operation of the SRAM cell of FIG. 1, according to an embodiment of the present invention.

Referring now to FIG. 11, a diagram illustrates a set of waveforms corresponding to a write-only operation of the test structure circuitry of FIG. 1, according to an embodiment of the present invention. There is no read operation, and the output latches are not updated. Transmission gates T1, T2 are closed in response to the failure to provide a second sharp edge. However, this has no impact, since prior to another write, read, or write-read cycle the bitlines are fully preconditioned for a time >1 ms during the latch reset cycle.

Figure 12:
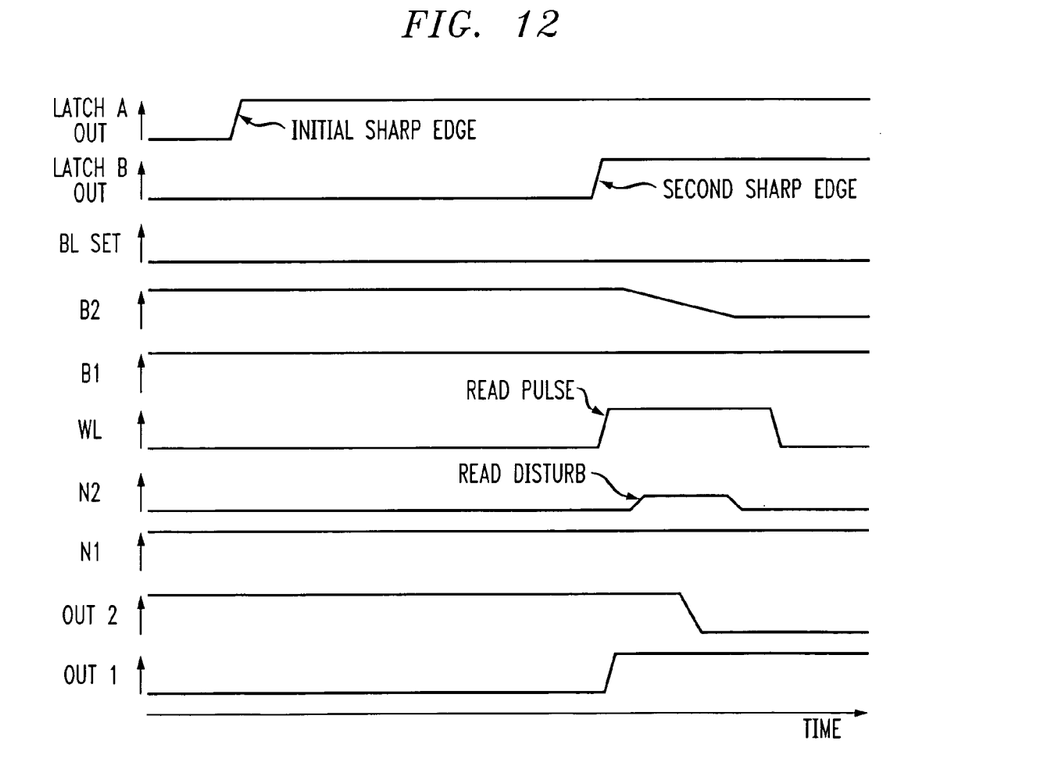
FIG. 12 is a diagram illustrating a set of waveforms corresponding to read-only operation of the SRAM cell of FIG. 1, according to an embodiment of the present invention.

Referring now to FIG. 12, a diagram illustrates a set of waveforms corresponding to read-only operation of the SRAM cell of FIG. 1, according to an embodiment of the present invention. In this mode of operation there is no bit line set pulse and no write pulse. The read operation follows exactly as in the second part of the write-read cycle, with the output latches being updated at the end. A write only cycle followed by a read only cycle is in fact the limiting case of a write-read cycle with a very long (many ms) delay between the write and the read.

With m2=0 and m1=1 the frequency of the ring oscillator can be measured. An output mux 140 associated with Out1 is configured such that with these mode select settings the frequency divided ring oscillator output appears at Out1. For the other three modes of operation Out1 gives directly the output of LatchC 108.

Figure 13:
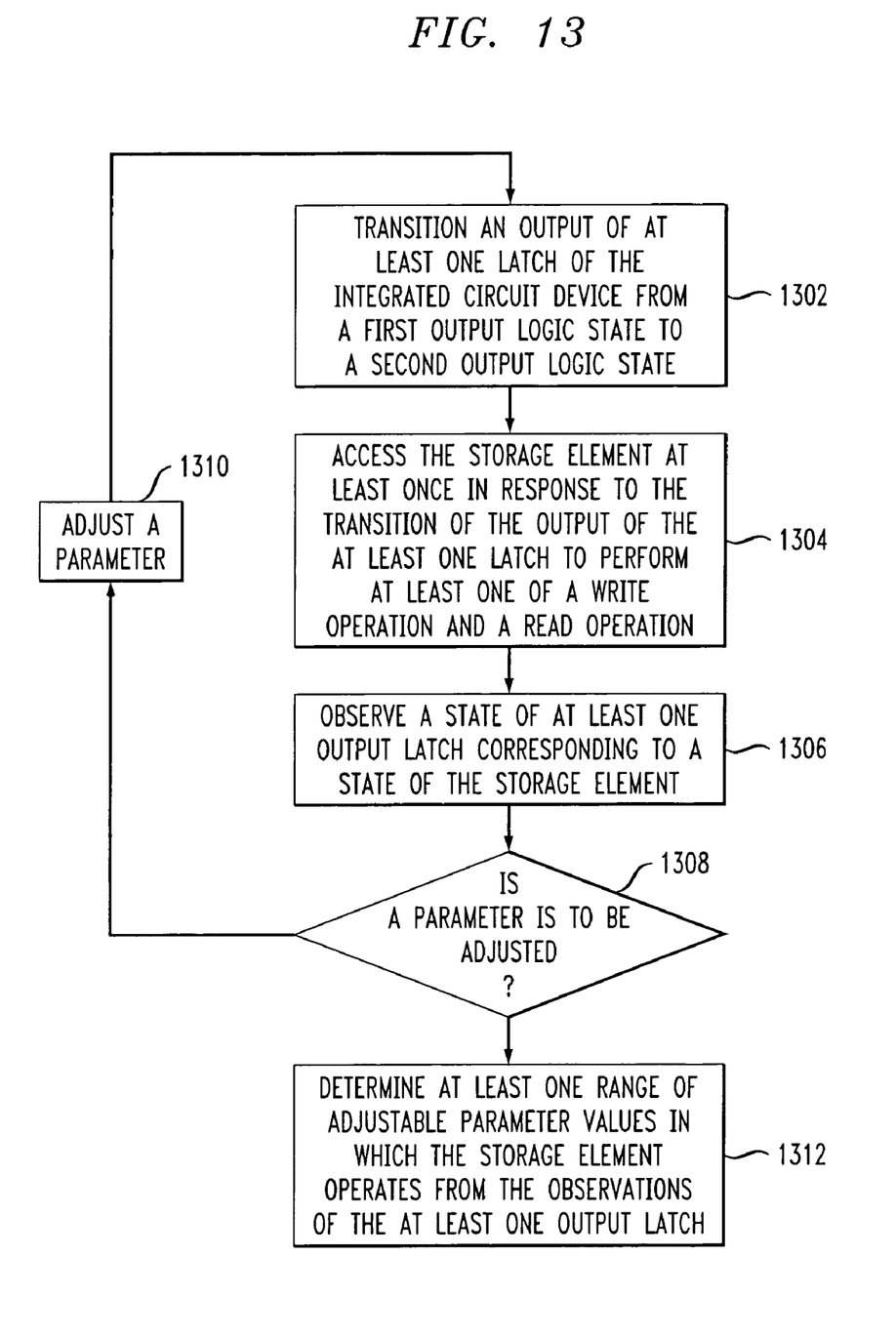
FIG. 13 is a flow diagram illustrating an inline characterization methodology of at least one high speed operating margin of a storage element, according to an embodiment of the present invention.

Referring now to FIG. 13, a flow diagram illustrates an inline characterization methodology of at least one high speed operating margin of a storage element. In block 1302, an output of at least one latch of the integrated circuit device is transitioned from a first output logic state to a second output logic state. In block 1304, the storage element is accessed at least once in response to the transition of the output of the at least one latch to perform at least one of a write operation and a read operation. In block 1306, a state of at least one output latch is observed corresponding to a state of the storage element. In block 1308, it is determined if a parameter is to be adjusted. If a parameter is to be adjusted, the adjustment is performed in block 1310 and the methodology returns to block 1302. If a parameter is not to be adjusted, the methodology continues to block 1312 where at least one range of adjustable parameter values in which the storage element operates is determined from the observations at the at least one output latch, terminating the methodology.

In accordance with the embodiment of the present invention illustrated in FIG. 13, when the output of a first latch of the integrated circuit device is transitioned the one or more adjustable parameters may comprise a voltage level, a pulsewidth of a wordline write pulse or a pulsewidth of a bit line set pulse in order to determine a write operating margin of the SRAM cell. When the output of a first and second latch are transitioned the one or more adjustable parameters may further comprise a pulsewidth of a wordline read pulse and a write-to-read delay in order to determine a write operating margin and a read operating margin of the SRAM cell as a function of write-to-read delay. Additionally, a second latch may be transitioned to determine a read operating margin of the SRAM cell.

The test structure circuitry described above is one example of a broader class of SRAM test structures operating on similar principles. For example in FIG. 1, DLC 138 could be replaced with a variable delay, such as, for example, AJDLA 130, to provide variable width wordline read pulses. This could be used to study SRAM cell read time as a function of various bias voltages (AWLPWR, ABLPWR, and ACLPWR) as well as different sense amplifier configurations. While the circuit in FIG. 1 is configured to address a single cell, the basic idea can be extended to addressing a set of cells in a larger array. For, example, by adding a two bit wordline decoder and a two bit bitline decoder, 16 different cells in a 1 k array could be individually addressed and characterized in the same way as the single cell in FIG. 1.

The most complex scenario exercised by the circuit in FIG. 1 is a write followed by a read of the same cell. In the same way that LATCHB 104 is configured to be activated by LATCHA 102, a third latch could be configured to be activated by LATCHB 104, and so on. It would thus be possible to exercise a single cell through a series of high speed write and read operations in rapid succession to characterize cell behavior under such conditions. In this case the B12 input could be incorporated into the test structure circuitry so that the state of the cell could be toggled as high speed scenario progressed. Finally with multiple read cycles and write cycles and an array of addressable cells, various pattern effects could be studied as a function of time and as a function of the amplitude of various bias voltages. In all of these cases the circuitry would be completely self timed and would require only DC I/O such that specific scenarios of interest could be configured as inline tests to be measured with standard inline parametric measurement equipment.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for characterization of at least one high speed operating margin of a storage element comprising the steps of:

transitioning an output of at least one latch of the integrated circuit device from a first output logic state to a second output logic state;

accessing the storage element at least once in response to the transition of the output of the at least one latch to perform at least one of a write operation and a read operation;

observing a state of at least one output latch corresponding to a state of the storage element; and repeating the transitioning, accessing and observing steps for one or more adjustable parameters to determine at least one range of adjustable parameter values in which the storage element operates.

2. The method of claim 1, wherein, in the step of transitioning an output of at least one latch, the at least one latch is transitioned in response to a substantially direct current (DC) input, and wherein, in the step of observing a state of at least one output latch, the state of the at least one output latch is observed in accordance with a substantially DC output.

3. The method of claim 1, wherein, in the step of transitioning an output, the at least one latch comprises a first latch of the integrated circuit device.

4. The method of claim 3, wherein the storage element comprises a static random access memory (SRAM) cell, and wherein the step of accessing the storage element comprises the step of writing a logic state into the SRAM cell in response to the transition of the output of the first latch.

5. The method of claim 4, wherein the step of writing a logic state into the SRAM cell comprises the steps of:
generating a bit line set pulse from a bit line set pulse generator in response to the transition of the output of the first latch;
maintaining a level representative of a logical state of a first bit line of the integrated circuit device and changing a level representative of a logical state of a second bit line of the integrated circuit device in response to the bit line pulse;
generating a wordline write pulse from a wordline write pulse generator in response to the transition of the output of the first latch; and
storing the maintained level representative of a logical state of the first bit line on a first node of the SRAM cell and the changed level representative of a logical state of the second bit line on the second node of the SRAM cell.

6. The method of claim 5, wherein the step of maintaining a level representative of a logical state and changing a level representative of a logical state comprises the steps of:
maintaining a first transmission gate and a second transmission gate of the integrated circuit device open to the first and second bit lines;
driving a first two-input NAND gate (NAND2) bit line driver and a second NAND2 bit line driver in accordance with the bit line set pulse;
changing the level representative of a logical state of the second bit line through the second NAND2 bit line driver in accordance with the bit line set pulse, an input logic state, and the second open transmission gate; and
restoring the level representative of a logical state of the second bit line upon termination of the bit line set pulse.

7. The method of claim 5, wherein the step of storing the maintained level representative of a logical state and the changed level representative of a logical state comprises the steps of:
applying the wordline write pulse to a wordline of the integrated circuit device;
opening a first passgate and a second passgate of the SRAM cell in response to the applied wordline write pulse to the wordline of the integrated circuit device;
writing the maintained level representative of a logical state of the first bit line to the first node of the SRAM cell via the first passgate and the changed level representative of a logical state of the second bit line to the second node of the SRAM cell via the second passgate; and
closing the first passgate and the second passgate upon termination of the wordline write pulse.

8. The method of claim 4, wherein, in the step of repeating the transitioning, accessing and observing steps, the at least one range of adjustable parameter values comprises the write operating margin of the SRAM cell.

9. The method of claim 4, wherein, in the step of transitioning an output, the at least one latch further comprises a second latch of the integrated circuit device whose output is transitioned from a first output logic state to a second output logic state in response to the transition of the output of the first latch.

10. The method of claim 9, wherein the step of accessing the storage element further comprises the step of reading at least one level representative of a logical state from at least one node of the SRAM cell in response to the transition of the output of the second latch.

11. The method of claim 10, wherein the step of reading at least one level representative of a logical state comprises the steps of:
generating a wordline read pulse from a wordline read pulse generator in response to the transition of the output of the second latch;
capturing a first level representative of a logical state at a first output latch and a second level representative of a logical state at a second output latch in accordance with the wordline read pulse; and
reading the output of the first output latch and the second output latch.

12. The method of claim 11, wherein the step of capturing the first and second levels comprises the steps of:
closing a first transmission gate and a second transmission gate in response to the transition of the output of the second latch in order to maintain levels representative of logical states of a first bit line and a second bit line;
opening a first passgate and a second passgate to the SRAM cell;
sending a signal to a clock port of the first output latch and a clock port of the second output latch in response to the transition of the output of the second latch;
transitioning the level representative of a logical state of the second bit line in accordance with the level representative of a logical state of the second node of the SRAM cell via the open second passgate; and
capturing the level representative of a logical state at the first bit line at the first output latch and the level representative of a logical state at the second bit line at the second output latch before the clock signals of the first and second output latches terminate with the wordline read pulse.

13. The method of claim 11, wherein, in the step of repeating the transitioning, accessing and observing steps, the one or more adjustable parameters comprise at least one of a voltage level, a pulsewidth of a bit line set pulse, a pulsewidth of a wordline write pulse, a pulsewidth of the wordline read pulse, and a write-to-read delay.

14. The method of claim 10, wherein, in the step of repeating the transitioning, accessing and observing steps, the at least one range of parameter values in which the storage element operates comprises at least one of a write operating margin of the SRAM cell and a read operating margin of the SRAM cell as a function of write to read delay.

15. The method of claim 1, wherein, in the step of transitioning an output, the at least one latch comprises a second latch of the integrated circuit device.

16. The method of claim 15, wherein, in the step of accessing the storage element, the storage element comprises an SRAM cell, and wherein the step of accessing the storage element comprises the step of reading at least one level representative of a logical state from at least one node of the SRAM cell in response to the transition of the output of the second latch.

17. The method of claim 15, wherein, in the step of repeating the transitioning, accessing and observing steps, the at least one range of parameter values in which the storage element operates comprises the read operating margin of the SRAM cell.

18. The method of claim 1, wherein the storage element comprises a static random access memory (SRAM) cell, and wherein the step of accessing the storage element comprises the steps of writing a first logic state into the SRAM cell in response to the transition of the output of the first latch, writing a second logic state into the SRAM cell, wherein the second logic state is different than the first logic state, and reading at least one level representative of a logical state from at least one node of the SRAM cell.

19. An article of manufacture for characterization of at least one high speed operating margin of a storage element, comprising a machine readable medium containing one or more programs which when executed implement the steps of:

transitioning an output of at least one latch of the integrated circuit device from a first output logic state to a second output logic state;

accessing the storage element at least once in response to the transition of the output of the at least one latch to perform at least one of a write operation and a read operation;

observing a state of at least one output latch corresponding to a state of the storage element; and repeating the transitioning, accessing and observing steps for one or more adjustable parameters to determine at least one range of adjustable parameter values in which the storage element operates.

20. An integrated circuit device comprising:

at least one latch having an output that transitions from a first output logic state to a second output logic state;

a storage element accessed at least once in response to a transition of the output of the at least one latch to perform at least one of a write operation and a read operation;

at least one output latch having a state capable of being observed that corresponds to a state of the storage element;

wherein at least one range of adjustable parameter values in which the storage element operates is determined from the observation of the state of the at least one output latch for one or more adjustable parameters.

* * * * *